United States Patent [19]
Hogervorst et al.

[11] Patent Number: 5,561,396
[45] Date of Patent: Oct. 1, 1996

[54] RAIL-TO-RAIL INPUT STAGES WITH $G_M$-CONTROL BY MULTIPLE INPUT PAIRS

[75] Inventors: Ronald Hogervorst, Voorschoten; Johan Huijsing, Schipluiden, both of Netherlands; John P. Tero, Saratoga, Calif.

[73] Assignee: Philips Electronics North America Corporation, New York, N.Y.

[21] Appl. No.: 430,517

[22] Filed: Apr. 27, 1995

[51] Int. Cl.$^6$ .................................................. H03F 3/45
[52] U.S. Cl. .......................... 330/253; 330/257; 330/258; 330/261
[58] Field of Search ..................................... 330/253, 257, 330/258, 252, 261

[56] References Cited

U.S. PATENT DOCUMENTS

| | | | |
|---|---|---|---|
| 4,555,673 | 11/1985 | Huijsing et al. | 330/258 |
| 5,208,552 | 5/1993 | Ryat | 330/253 |
| 5,280,199 | 1/1994 | Itakura | 330/253 X |
| 5,384,548 | 1/1995 | Sakurai et al. | 330/261 X |

FOREIGN PATENT DOCUMENTS

| | | | |
|---|---|---|---|
| 6177672 | 6/1994 | Japan | 330/253 |

OTHER PUBLICATIONS

"A Low Voltage CMOS OP Amp with a Rail-to-Rail Constant-Gm Input Stage and a Class AB Rail-to-Rail Output Stage" J. H. Botma et al, IEEE J. Solid State Circuits, vol. SC-20, pp. 1144-1150 Dec. 1985.

"CMOS Low-Voltage Operational Amplifiers with Constant Gm Rail-to-Rail Input Stage" R. Hogervorst et al, Proceedings Iscas 92, pp. 2876-2879.

"A Rail-to-Rail Input/Output CMOS Power Amplifier" M. D. Pardoen et al, IEEE J. Solid State Circuits, vol. SC 25, pp. 501-504 Dec. 1990.

"A Compact Power Efficient Rail-to-Rail Input/Output Amplifier for VLSI Cell Libraries" R. Hogervorst et al, Digest ISSCC94, Feb. 1994, pp. 2444-2445.

CMOS Low-Voltage Operational Amplifiers with Constant-$g_m$ Rail-to-Rail Input Stage, By Ron Hogervorst Et Al, Analog Integrated Circuits and Signal Processing 5, 135-146 (1994).

Low-Voltage Operational Amplifier with Rail-to-Rail Input and Output Ranges, by Johan H. Huijsing Et Al, IEEE, 1985, pp. 1114-1150.

*Primary Examiner*—James B. Mullins
*Attorney, Agent, or Firm*—Steven R. Biren

[57] ABSTRACT

A transconductance ($g_m$) control circuit for bipolar or CMOS rail-to-rail input stages is provided. The $g_m$ is controlled by the use of multiple input pairs and can be used in CMOS or bipolar technology. In CMOS the $g_m$-control works regardless of the operating region of the MOS transistor, whether it is weak, moderate or strong inversion.

6 Claims, 3 Drawing Sheets

5,561,396

RAIL-TO-RAIL INPUT STAGES WITH $G_M$-CONTROL BY MULTIPLE INPUT PAIRS

BACKGROUND OF THE INVENTION

1. Field of the Invention

The present invention relates to operational amplifiers. More particularly, it relates to controlling the transconductance ($g_m$) of the input stages of an operational amplifier to improve performance and enhance applications.

2. The Prior Art

U.S. Pat. No. 4,555,673 to Huijsing et al. discloses a differential amplifier with rail-to-rail input capability and controlled transconductance ($g_m$). The method employed for controlling the transconductance uses current control or current switches to steer at least part of the supply current away from at least one of the differential portions of the input stage when the common mode voltage is in at least one part of the supply range.

Other methods for controlling the transconductance ($g_m$) of the input stages of operational amplifiers with CMOS technology use square root circuits, three times current mirrors, and current switches in order to maintain the $g_m$ of the input stages substantially constant. (Botma, J. H., et al., "A low-voltage CMOS operational amplifier with rail-to-rail constant-gm input stage and class-AB rail-to-rail output stage", Proceeding ISCAS93, pp.1314–1317; Hogervorst, R. et al., "CMOS low-voltage operational amplifiers with constant-gm rail-to-rail input stage", Proceedings ISCAS92, pp.2876–2879; R. Hogervorst, J. P. Tero, R. G. H. Rschauzier, J. H. Huijsing, "A compact power-efficient rail-to-rail input/output amplifier for VLSI cell libraries". in Digest ISSCC94, February 1994.)

The main drawbacks of these existing $g_m$-controlled rail-to-rail input stages can be found in CMOS technology. Specifically, they are not appropriate for MOS complementary input stages operating in moderate inversion. That is, the transition region between weak and strong inversion. An input stage is frequently biased in moderate inversion because it is a good compromise between a low-offset and a high slew rate.

Another drawback which occurs particularly in CMOS input stages operating in strong inversion, is that the common-mode output currents are 4 times larger at the outer parts of the common-mode input range compared to the intermediate part of the common-mode input range.

Furthermore, the $g_m$ of a CMOS complementary input stage can only be varied over a small range which limits the applicability for which the circuit may be used. In opamps intended for VLSI cell libraries it is often required that the $g_m$ of the input stage be adapted over a large range, so that the specification of the opamp can easily be changed to the need of the specific application.

SUMMARY OF THE INVENTION

The present invention provides a constant transconductance ($g_m$) for rail-to-rail input stages which overcome the drawbacks of the prior art $g_m$ control circuits and methods.

According to the invention, the transconductance $g_m$ is controlled and regulated by adding multiple differential input pairs to the input stage of the amplifier configuration.

It is therefore an object of the present invention to provide a method and apparatus for maintaining the transconductance ($g_m$) of an input stage of an operational amplifier constant over a large operating range.

Another object of the invention is to provide a method and apparatus for controlling the $g_m$ of the input stage of an operational amplifier using either bipolar or CMOS technology.

It is another object of the invention to provide a method and apparatus for $g_m$-control with CMOS technology that operates efficiently regardless of the operating region of the MOS transistor.

Yet another object of the invention is to provide a method and apparatus for $g_m$-control that reduces the power dissipation of CMOS input stages biased in the strong inversion operating region.

Another object of the invention is to provide a method and apparatus for $g_m$-control that is suitable for CMOS input stages operating in moderate inversion.

It is a further object of the invention to provide a method and apparatus for $g_m$-control that avoids a waste of power in the folded cascoded summing circuit by maintaining the sum of the tail currents of the input pairs constant.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
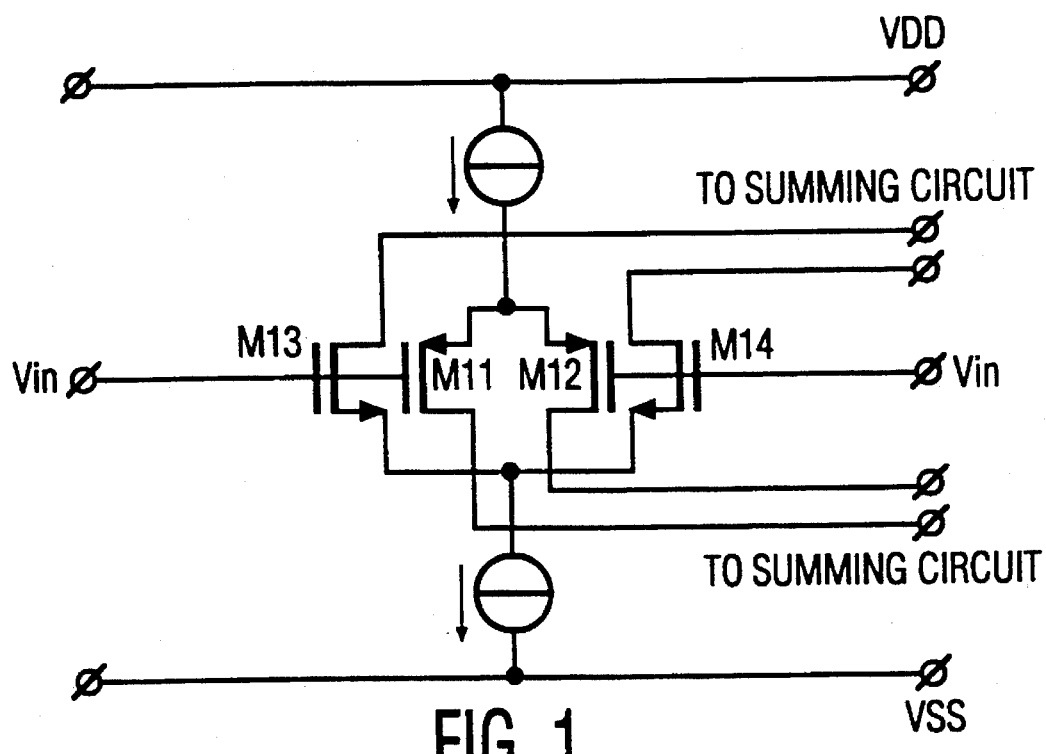
FIG. 1 is a schematic diagram of the input stage of an operational amplifier of the prior art.

FIG. 1 shows an example of an input stage of an operational amplifier of the prior art. As shown, the input stage has a rail-to-rail common-mode input range which can be composed of two complementary differential input pairs. The input stage consists of an N-channel input pair, M13–M14, and a P-channel input pair, M11–M12. The common-mode input voltage range for such an input stage can be divided into three parts: (1) Low common-mode input voltages (only the P-channel input pair operates); (2) Intermediate common-mode input voltages; (both the P-channel and N-channel input pair operate); and, (3) High common-mode input voltages (only the N-channel input pair operates).

When the common-mode input voltage moves from one part of the common-mode input range into another, the transconductance ($g_m$) changes with a factor of two. Thus, since the unity-gain frequency of an amplifier is proportional to the $g_m$ of the input stage, changes in the $g_m$ impedes an optimal frequency compensation. Therefore, in order to obtain optimal frequency compensation over the whole common-mode input range, the $g_m$ of the input stage has to be constant.

Figure 2A:
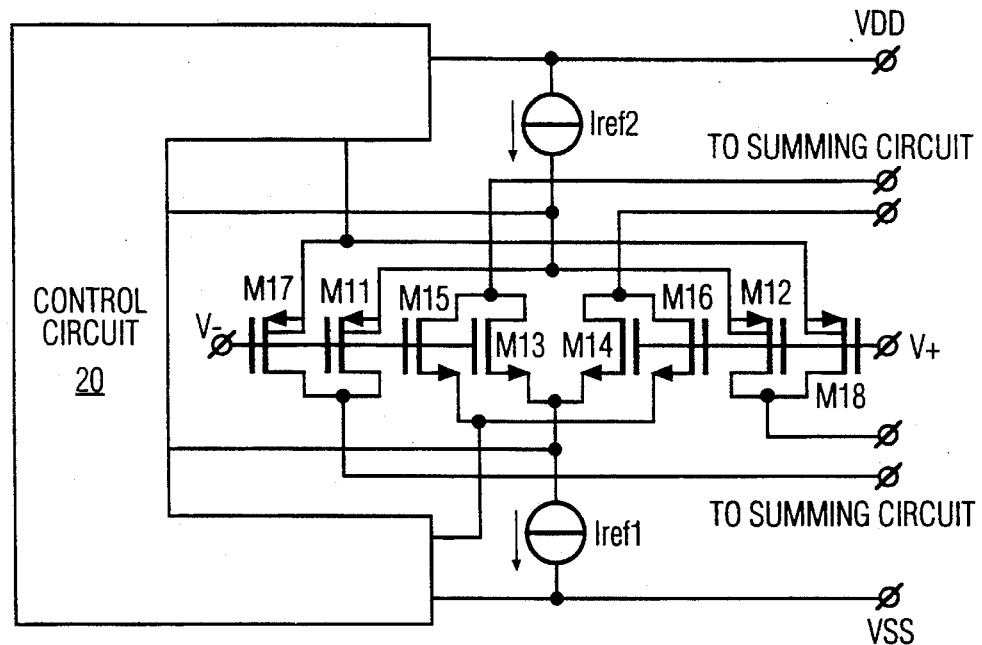
FIG. 2a is a partial block diagram of the controlled $g_m$ input stage according to the invention.

FIG. 2a shows the differential input stage M11–M14 with the two additional input pairs, M15–M16, and M17–M18, and control circuit 20. Control circuit 20 regulates the activation of the additional input pairs M15–M16, and M17–M18 in response to the change of the common-mode input voltage.

In the intermediate part of the common-mode input range, the P-channel input pair M11–M12 and the N-channel input pair M13–M14 are active. At the outer parts of the common-mode input range, control circuit 20 places one of the additional input pairs in parallel with the active input pair. As a result, the $g_m$ is increased by a factor of 2 at the outer parts of the common-mode input range. This principle works regardless of the technology used, whether it is bipolar of CMOS. Furthermore, it is independent of the operating region of the transistor, whether it is weak, moderate, or strong inversion.

Figure 2B:
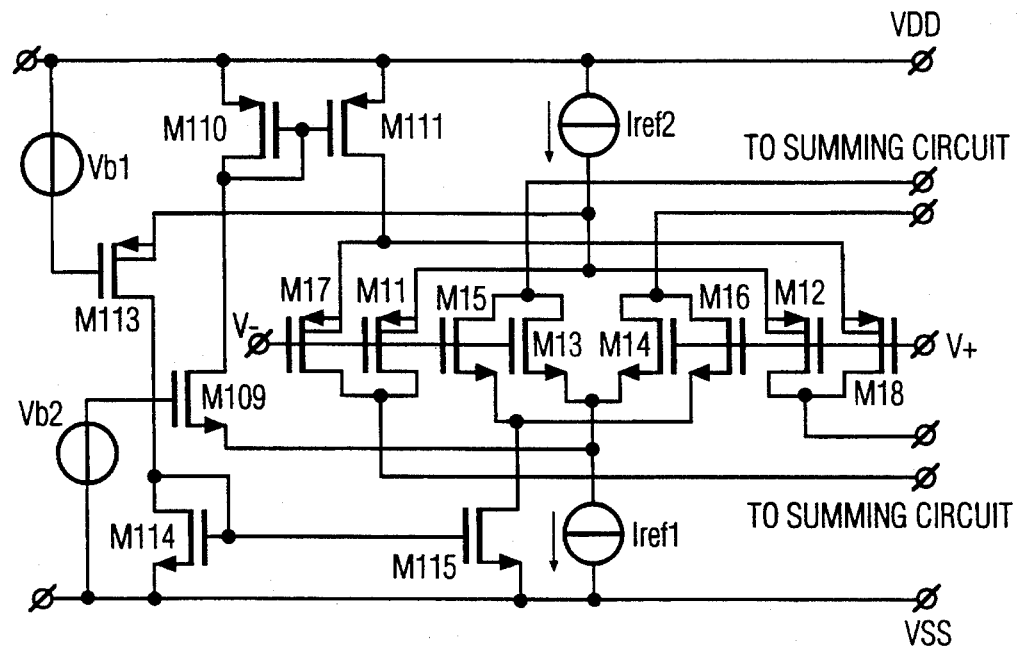
FIG. 2b is a schematic diagram of the controlled $g_m$ input stage according to the invention.

FIG. 2b shows a specific schematic example of the input stage where control circuit 20 includes two current switches M109 and M113, two current mirrors, M110–M111, and M114–M115, and threshold voltage sources Vb1 and Vb2. In the intermediate part of the common-mode input range, the P-channel input pair M11–M12 and the N-channel input pair M13–M14 are active.

If low common-mode input voltages are applied, only the P-channel input pair, M11–M12 operates. The N-channel current switch M109 conducts, while the P-channel current switch M113 is off. The N-channel current switch M109 takes away the tail current of the N-channel input pair M13–M14, and feeds it through current mirror M110–M111, into the additional P-channel input pair M17–M18. Since the additional input pair M17–M18 is in parallel with the P-channel input pair M11–M12, the total transconductance is equal to $2g_m$.

If intermediate common-mode input voltages are applied, both the P-channel input pair M11–M12, as well as the N-channel input pair M13–M14, operate. In this range, both current switches M109 and M113 are off. As a consequence, the N-channel and the P-channel input pair have a tail current of $I_{ref}$. Thus, assuming that the $g_m$ of the P-channel and the N-channel input pair is equal, the total transconductance of the complementary input stage is equal to $2g_m$.

If high common-mode input voltages are applied, only the N-channel input pair M13–M14 operates. The P-channel current switch M113 conducts, while the N-channel current switch M109 is off. The P-channel current switch M113 takes away the tail current of the P-channel input pair M11–M12 and directs it, via the current mirror M114–M115, into the additional N-channel input pair M15–M16. Since the additional input pair is in parallel with N-channel input pair M13–M14, the total transconductance of the input stage is equal to $2g_m$.

It should be noted that the sum of the tail-currents is constant over the common-mode input range. Especially for CMOS input stages operating in strong inversion, this results in a reduction of the power consumption. Thus, the summing circuit, which follows the input stage, can be biased at a current which is two times smaller compared to existing technology.

Figure 3B:
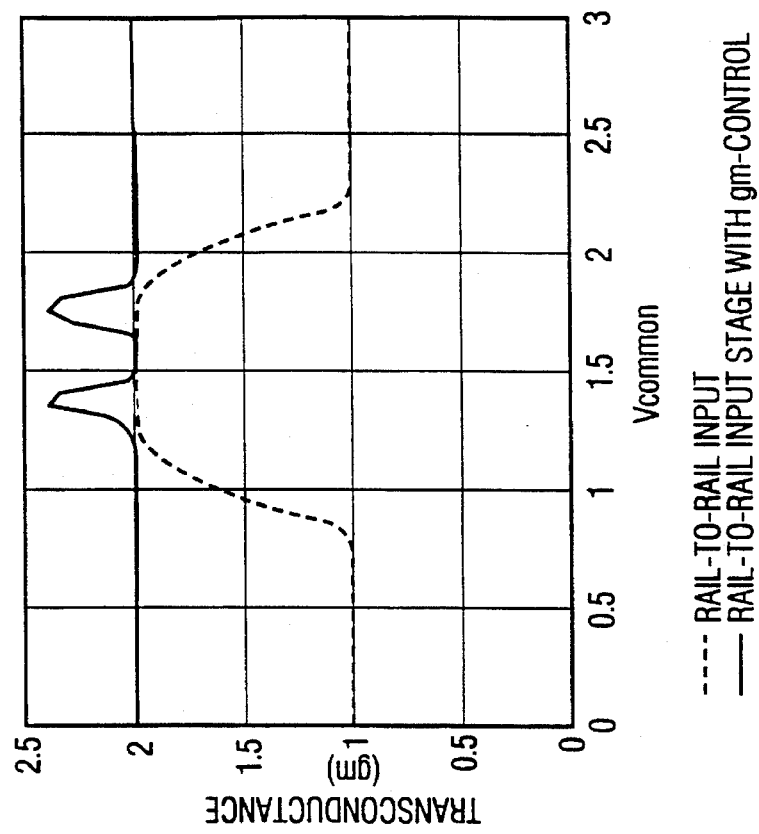
FIG. 3b is a graphical representation of the transconductance versus the common mode input range in strong inversion according to the invention.
Figure 3A:
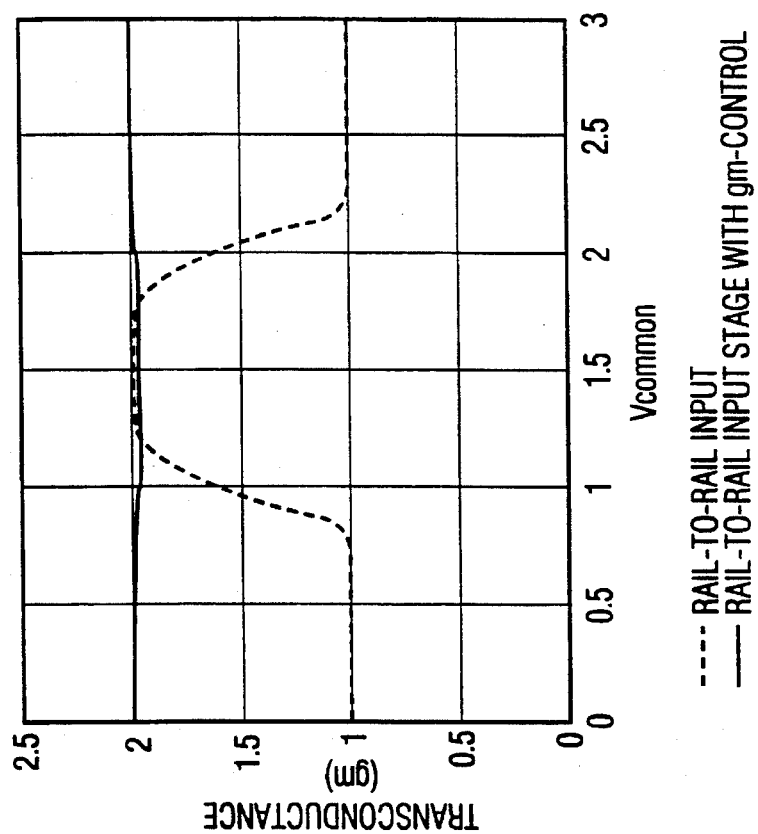
FIG. 3a is graphical representation of the transconductance versus the common mode input range in weak inversion according to the invention.

FIGS. 3a and 3b show a graphical representation of the normalized transconductance ($g_m$) as a function of the common-mode input range for the circuit according to the invention. FIG. 3a shows that the $g_m$ is constant over the common-mode input range when a bipolar or a CMOS input stage biased in weak inversion is used. FIG. 3b shows that the $g_m$ is also constant for a CMOS input stage operating in strong inversion, except for two takeover regions 30 and 32 where the transconductance varies about 20%. In these take-over regions, the current through current switches M109 and M113 varies from 0 to $I_{ref}$ or vice versa.

Control circuit 20 (FIG. 2a) can be adapted to further reduce the variation in the transconductance in take over regions 30 and 32. For example, by changing the value of threshold voltage sources Vb1 and Vb2 and the specific values of some of the components in control circuit 20, the $g_m$ in takeover regions 30 and 32 can be made smaller.

When common-mode input voltages are applied at the lower end of the takeover region 30 to the circuit of FIG. 2b, increasing the width-to-length ratio of M110 will lower the transport of current in relation to M111. Thus, the transport ratio of mirror M110, M111 is now less than 1 and the $g_m$ of the takeover region 30 is diminished. To correct the $g_m$ again at the higher end of the take over region, an increase in current can be achieved by adding a resistor in series with the source of M111. The same principles apply for high common-mode input voltages and the respective components M114 and M115 associated therewith.

In another embodiment of the invention (not shown), the gm can be made more constant by adding more additional input pairs to the input stage of the opamp with spread spacing of the multiple take over regions.

While two embodiments of the present invention has been shown and described, it is to be understood that many changes and modifications may be made thereunto without departing from the spirit and scope of the invention as defined in the appended claims.

What is claimed is:

1. A circuit for controlling the transconductance (gm) of the rail-to-rail input stage of an operational amplifier (opamp), the input stage having at least an N-channel and a P-channel input differential pair of transistors each having a tail current, the opamp having a common-mode input voltage range including low, intermediate, and high common-mode input voltages, the circuit comprising:

an additional N-channel differential pair of transistors coupled to the N-channel input pair;

an additional P-channel differential pair of transistors coupled to the P-channel input pair; and control means coupled to both of said additional input pairs for activating one of said additional input pairs in response to low and high common-mode input voltages.

2. The circuit according to claim 1 wherein, said additional N-channel input pair is connected to the N-channel input pair of the input stage of the op amp in parallel, and said additional P-channel input pair is connected to the P-channel input pair of the input stage of the op amp in parallel.

3. The circuit according to claim 2, wherein said control means further comprises:

an N-channel current switch coupled to the N-channel input pair and said additional P-channel input pair;

a first current mirror having an input coupled to said N-channel current switch and an output coupled to said additional P-channel input pair;

a P-channel current switch coupled to the P-channel input pair and said additional N-channel input pair; and a second current mirror having an input coupled to said P-channel current switch and an output coupled to said additional N-channel input pair.

4. The circuit according to claim 3, wherein when low common mode voltages are applied to the input stage of the op amp, said N-channel current switch conducts the tail current of the N-channel input pair into said additional P-channel input pair via said first current mirror thereby controlling and maintaining the transconductance ($g_m$) of the input stage at a constant value.

5. The circuit according to claim 3, wherein when high common-mode voltages are applied to the input stage of the op amp, said P-channel current switch conducts the tail current of the P-channel input pair into said additional N-channel input via said second current mirror thereby controlling and maintaining the transconductance ($g_m$) of the input stage at a constant.

6. The circuit according to claim 3, wherein the input stage of the op amp has takeover regions having variable transconductance values, and whereby said control means is adapted to reduce the transconductance variation of the takeover regions of the input stage of the opamp.

\* \* \* \* \*